(12) United States Patent
Bathe et al.

(10) Patent No.: US 8,497,464 B2
(45) Date of Patent: Jul. 30, 2013

(54) DETECTOR ARRANGEMENT HAVING INCREASED SENSITIVITY

(75) Inventors: Wolfgang Bathe, Jena (DE); Michael Goelles, Jena (DE); Mirko Liedtke, Jena (DE)

(73) Assignee: Carl Zeiss Microscopy GmbH, Jena (DE)

( * ) Notice: Subject to any disclaimer, the term of this patent is extended or adjusted under 35 U.S.C. 154(b) by 242 days.

(21) Appl. No.: 12/856,792

(22) Filed: Aug. 16, 2010

(65) Prior Publication Data

US 2011/0042555 A1    Feb. 24, 2011

(30) Foreign Application Priority Data

Aug. 18, 2009 (DE) .......................... 10 2009 038 028

(51) Int. Cl.
*G01D 5/30* (2006.01)
*H01J 3/14* (2006.01)
*H01L 27/00* (2006.01)

(52) U.S. Cl.
USPC ............... 250/216; 250/208.1; 250/208.2; 359/368; 257/432

(58) Field of Classification Search
USPC .......... 250/216, 208.1, 208.2, 207, 214 VT, 250/227.32; 359/368, 393; 257/432
See application file for complete search history.

(56) References Cited

U.S. PATENT DOCUMENTS

| | | | |
|---|---|---|---|
| 4,689,291 A * | 8/1987 | Popovic et al. | 430/321 |
| 4,900,914 A * | 2/1990 | Raff et al. | 250/216 |
| 5,028,802 A * | 7/1991 | Webb et al. | 250/235 |
| 5,300,263 A * | 4/1994 | Hoopman et al. | 264/2.5 |
| 5,439,621 A * | 8/1995 | Hoopman | 264/2.5 |
| 5,682,266 A * | 10/1997 | Meyers | 359/571 |
| 5,952,645 A | 9/1999 | Wang et al. | |
| 6,157,017 A | 12/2000 | Kim | |
| 6,326,998 B1 * | 12/2001 | Palum | 348/342 |
| 7,351,977 B2 * | 4/2008 | Devitt et al. | 250/353 |
| 7,936,956 B2 * | 5/2011 | Marttila et al. | 385/36 |
| 7,941,013 B2 * | 5/2011 | Marttila et al. | 385/31 |
| 2001/0008287 A1 | 7/2001 | Kraiczek et al. | |
| 2004/0113059 A1 * | 6/2004 | Kawano et al. | 250/234 |
| 2009/0161364 A1 * | 6/2009 | Bremerich et al. | 362/268 |
| 2009/0194715 A1 * | 8/2009 | Schadwinkel et al. | 250/578.1 |
| 2011/0042555 A1 * | 2/2011 | Bathe et al. | 250/216 |

FOREIGN PATENT DOCUMENTS

| | | |
|---|---|---|
| DE | 201 00 418 U1 | 4/2001 |
| DE | 100 38 528 A1 | 2/2002 |
| DE | 103 13 606 A1 | 10/2004 |
| DE | 10 2006 039 073 A1 | 2/2008 |

* cited by examiner

*Primary Examiner* — John Lee
(74) *Attorney, Agent, or Firm* — Jacobson Holman PLLC

(57) ABSTRACT

To increase the sensitivity of detector arrangements, it is known that light deflection elements in the form of a line arrays having spherical elements may be used to focus incident light onto light-sensitive regions of the detector. Manufacturing such line arrays is complex and cost intensive, especially in small lot numbers. The increased sensitivity of the detector array can be achieved easily and inexpensively by using a novel light deflection element. The detector arrangement therefore has a light deflection element having light entrance surfaces, deflecting incident light by refraction onto light-sensitive regions of the detector. Light entrance surfaces of the light deflection element are inclined with respect to one another and are designed as planar surfaces. The detector arrangement is suitable in particular for detection of light emanating from a specimen in a microscope, preferably in a laser-scanning microscope.

12 Claims, 4 Drawing Sheets

US 8,497,464 B2

DETECTOR ARRANGEMENT HAVING INCREASED SENSITIVITY

CROSS-REFERENCE TO RELATED APPLICATIONS

The present patent application claims priority from German Application No. 10 2009 038 028.0, filed Aug. 18, 2009, which is incorporated herein by reference in its entirety.

BACKGROUND OF THE INVENTION (1) Field of the Invention

The invention relates to a device for detecting light, in particular light emanating from a specimen in a microscope, preferably a laser-scanning microscope.

(2) Description of Related Art Including Information Disclosed Under 37 CFR 1.97 and 1.98

Various types of detectors may be used for detection of light. These include, for example, CCD sensors, photomultipliers or photomultiplier tubes (PMT), and avalanche photodiodes (APD). Individual detectors are often combined to form one-dimensional or two-dimensional arrangements (line detectors or area detectors). Due to the design, the individual detector elements, also known as detector cells, are then spaced apart from each other. Therefore, such detector arrangements do not usually have a homogenous light-sensitive region. There are light-sensitive regions, which are interrupted by light-insensitive regions. When a bundle of light rays strikes such a detector arrangement, only that portion of the light striking the light-sensitive regions is detected. Light striking the light-insensitive regions cannot be detected. The efficiency of the detection arrangement is therefore reduced.

To solve the problem described above, it is known that those portions of light which would strike the light-insensitive regions of the detector arrangement without additional measures can be deflected onto the light-sensitive regions by means of light deflection elements. This increases the detection efficiency of the receiver, in the ideal case, up to the efficiency of a detector without light-insensitive regions.

The goal in general is the most homogeneous possible illumination of the light-sensitive regions, and reliably accurate focusing of the light on the light-sensitive regions. So-called lens arrays which focus the incident light by means of spherical elements and thus generate a light spot array are often used as light deflection elements. The detector is then arranged in such a way that the light-sensitive regions coincide with the light spot array. Such an arrangement is known from U.S. Pat. No. 6,157,017, for example. One disadvantage of the lens arrays described here is that they have spherical, i.e., curved surfaces. Such surfaces are much more complex to manufacture than planar surfaces.

DE 10038528 describes the use of lens arrays in the detection beam path of a laser-scanning microscope. Another approach is described in U.S. Pat. No. 5,952,645, where minor wedges are used as light deflection elements. One disadvantage of such an arrangement is the mechanical sensitivity of the narrower mirror wedges. In addition, this facilitates the deposition of dust between the wedges and thus on the light-sensitive regions.

BRIEF SUMMARY OF THE INVENTIONS

The object of the present invention is to provide a detector arrangement that will avoid the disadvantages described above, while being inexpensive and simple to manufacture.

The invention comprises a detector arrangement having a light deflection element that has light entrance surfaces that deflect the incident light by refraction onto light-sensitive regions of a detector, where one of the light entrance surfaces is designed as a planar surface.

In an alternative embodiment, the invention comprises a detector arrangement having a detector and a light deflection element consisting of first and second light entrance surfaces, where the first and second light entrance surfaces are designed as planar surfaces and the second light entrance surfaces are inclined with respect to the first light entrance surfaces.

According to the invention, it has been recognized that in certain applications, accurate illumination of the light-sensitive regions or accurate focusing on the light-sensitive regions of the detector arrangement is not necessary. It is essential only that the light reaches the light-sensitive regions of the detector arrangement at all. Depending on the type of detector, the most complete possible illumination of the detector element may even be advantageous because intensity peaks of the light on the light-sensitive regions are prevented in this way and thus the risk of nonlinear detector signals or even possible beam damage is minimized.

Thus, it is not necessary to use complicated lens systems like those in the prior art. Instead, lenses having essentially planar surfaces may be used, and such lenses can also be manufactured easily and inexpensively in small quantities.

BRIEF DESCRIPTION OF THE SEVERAL VIEWS OF THE DRAWINGS

The present invention will now be explained on the basis of the following drawings.

DETAILED DESCRIPTION OF THE INVENTION

Figure 1:
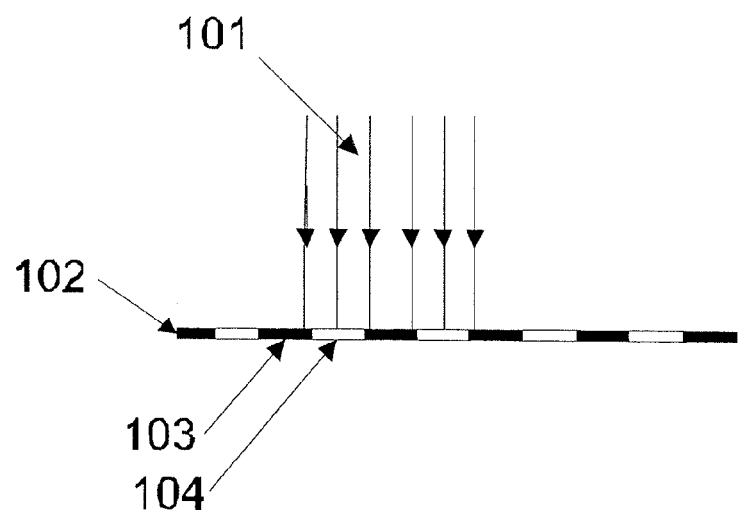
FIG. 1 is a schematic drawing of a linear light receiver.

In describing preferred embodiments of the present invention illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose.

FIG. 1 shows a one-dimensional (linear) light receiver (line detector) 102 having light-insensitive regions 103 and light-sensitive regions 104. Light 101 strikes both light-insensitive regions 103 and the light-sensitive regions 104. Thus only a portion of the incident light can be detected.

Figure 2:
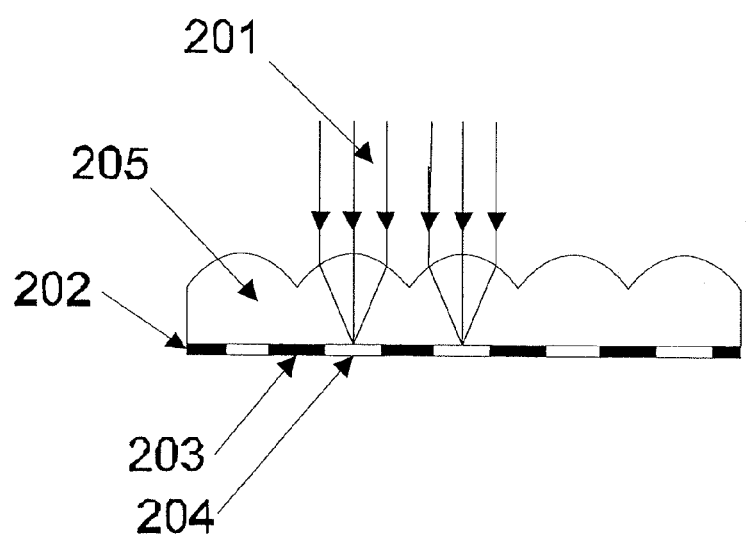
FIG. 2 is a schematic drawing of a prior art one-dimensional light receiver and light deflection element.

FIG. 2 shows an arrangement according to the prior art in the case of a one-dimensional (linear) light receiver. The line array 205 having spherical lenses is situated above the detector line 202 and bundles the light 201 onto the former. Light striking the lenses above the light-insensitive black areas 203 is also deflected onto the light-sensitive regions 204. The disadvantage of this arrangement is that it is complicated to manufacture the line array 205 having spherical surfaces and is especially expensive for small quantities.

Figure 3:
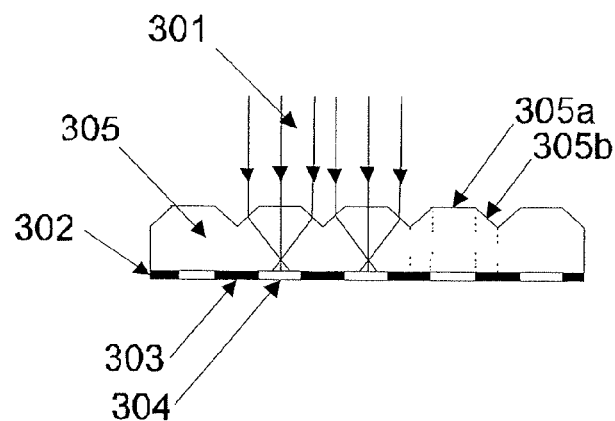
FIG. 3 is a schematic drawing of a first embodiment of a one-dimensional light receiver and light deflection element incorporating the present invention.

FIG. 3 shows a first exemplary embodiment of the arrangement. This shows an arrangement for a one-dimensional (linear) light receiver (line detector) 302. The light entrance surface 305a is arranged perpendicular or almost perpendicular to the incident light above the light-sensitive regions 304. Light that strikes these areas is deflected hardly or not at all by the refraction of the light deflection element 305 and thus strikes the light-sensitive regions 304 beneath it. Above the light-insensitive regions 303, the light entrance surfaces 305b of the light deflection element 305 are inclined with respect to the incident light and the light entrance surfaces 305a, so that the light is deflected in its passage through the light entrance surface 305b by refraction onto the light-sensitive regions 304 of the detector 302. The inclination of the light entrance surface is determined by the size and arrangement of the light-sensitive regions and the light-insensitive regions, by the thickness and the refractive index of the light deflection element 305 as well as by the distance of the light deflection element from the light-sensitive regions. The light deflection element 305 consists only of planar surfaces except for surfaces that are curved due to the manufacturing process and therefore it is simple to manufacture because no spherical surfaces having fixedly predefined tolerances need be created.

The light deflection element 305 may be positioned directly on the line detector 302 as shown in FIG. 3. Alternatively, the element may be positioned in its own frame at a distance from the line detector.

Figure 8:
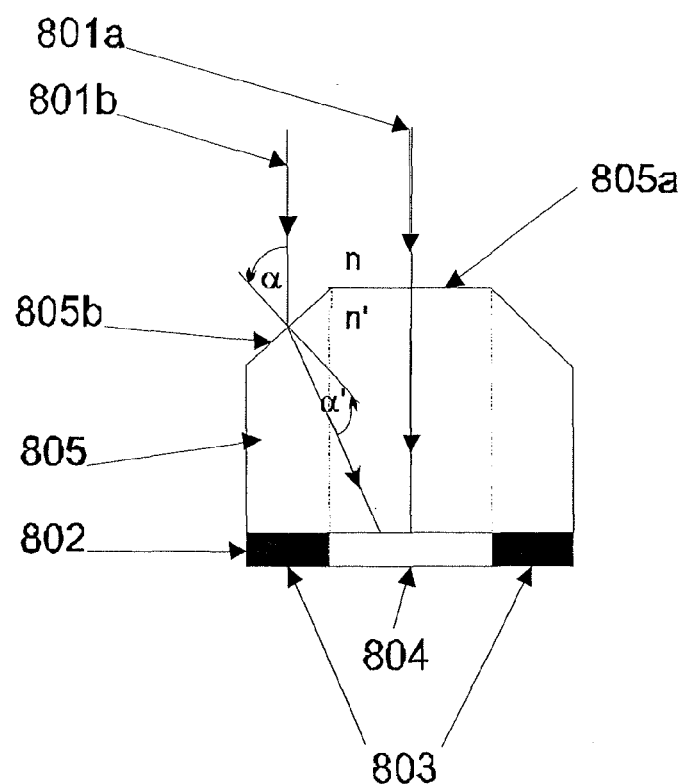
FIG. 8 is a schematic drawing of a single light deflection element and a single light detector element for the embodiment shown in FIG. 3.

FIG. 8 illustrates the principle of the light deflection element again on the basis of a single detector element 802. The detector element 802 consists of a light-insensitive region 803 and a light-sensitive region 804, above which the light deflection element 805 is situated. The light entrance surface 805a above the light-sensitive region 804 is arranged essentially perpendicular to the incident light 801a, 801b. The light 801a striking these surfaces is deflected hardly or not at all by the refraction of the light deflection element 805 and thus strikes the light-sensitive regions 804 beneath the light deflection element. Above the light-insensitive regions 803, the light entrance surfaces 805b of the light deflection element 805 are inclined with respect to the incident light 801b and with respect to the light entrance surface 805a, so that the light 801b is deflected by refraction onto the light-sensitive region 804 of the detector 802 in its passage through the light entrance surface 805b. The inclination of the light entrance surface 805b is determined by its distance from the detector 802, the size of the light-sensitive region 804 and the refractive index n' of the light deflection element 805. The inclination of the light entrance surface 805b is preferably selected so that light striking the edges of the light entrance surface 805b will also strike the light-sensitive region 804.

FIG. 3 shows an arrangement that is symmetrical with the light-sensitive regions 304, in which light that would strike half of the light-insensitive region 303 is deflected onto the light-sensitive region 304 situated at the left and light that would strike the other half is deflected onto the light-sensitive region on the right.

Figure 4:
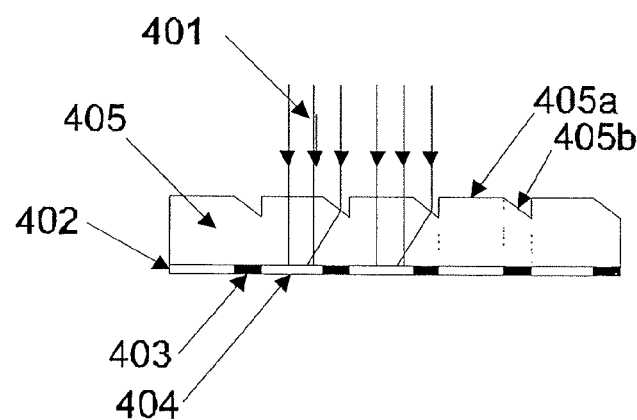
FIG. 4 is a schematic drawing of a second embodiment of a one-dimensional light receiver and light deflection element incorporating the present invention.

Similarly, it is possible to deflect all the light which would strike the light-insensitive regions 403 in one direction. This is illustrated in FIG. 4, where all the light that would strike the light-insensitive regions is deflected onto the light-sensitive region 404 on the left. The light entrance surface 405a is arranged perpendicular or almost perpendicular to the incident light above the light-sensitive regions 404. Light which strikes these areas is deflected hardly or not at all by the refraction of the light deflection element 405 and thus strikes the light-sensitive regions 404 beneath it. Above the light-insensitive regions 403, the light entrance surfaces 405b of the light deflection element 405 are inclined with respect to the incident light and the light entrance surfaces 405a, so that the light is deflected in its passage through the light entrance surface 405b by refraction onto the light-sensitive regions 404 of the detector 402.

Figure 5:
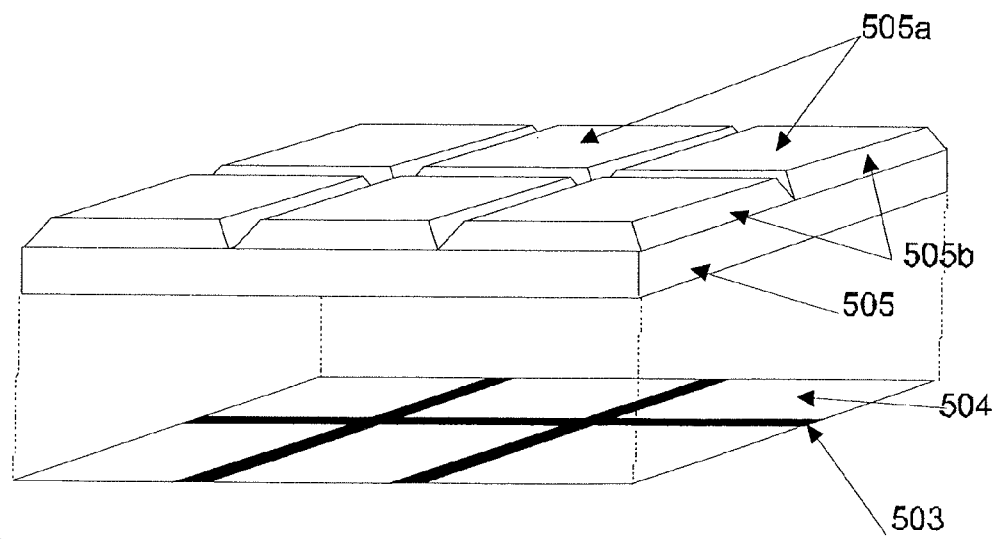
FIG. 5 is a schematic drawing of another embodiment of a two-dimensional light receiver and light deflection element incorporating the present invention.

The present invention is not limited to one-dimensional detectors. In this regard, FIG. 5 shows a two-dimensional flat detector. All the light-sensitive regions 504 are separated from one another by light-insensitive webs 503. This also shows an appropriate light deflection element 505. The element functions in principle exactly like that shown in FIG. 3: light striking the light entrance surfaces 505b above the light-insensitive regions is deflected to the side and thus strike the light-sensitive regions 504. The light entrance surfaces 505b of the light deflection element 505 are inclined with respect to the incident light and the light entrance surfaces 505a.

By analogy with the one-dimensional elements, symmetrical and/or reflective elements are also possible.

Light deflection elements according to the present invention may be manufactured from transparent materials having a suitable refractive index and transmission properties for the wavelength range to be detected. Polymethyl methacrylate (PMMA) is especially suitable because it can be processed easily and accurately.

The inventive light deflection elements can be produced by milling the light entrance surfaces in a contiguous transparent material. Alternatively, individual elements, for example, prisms may be combined to form a light deflection element. The present invention may be used preferably but not exclusively for spectral detection using a PMT line detector in a laser scanning microscope (LSM).

Figure 6:
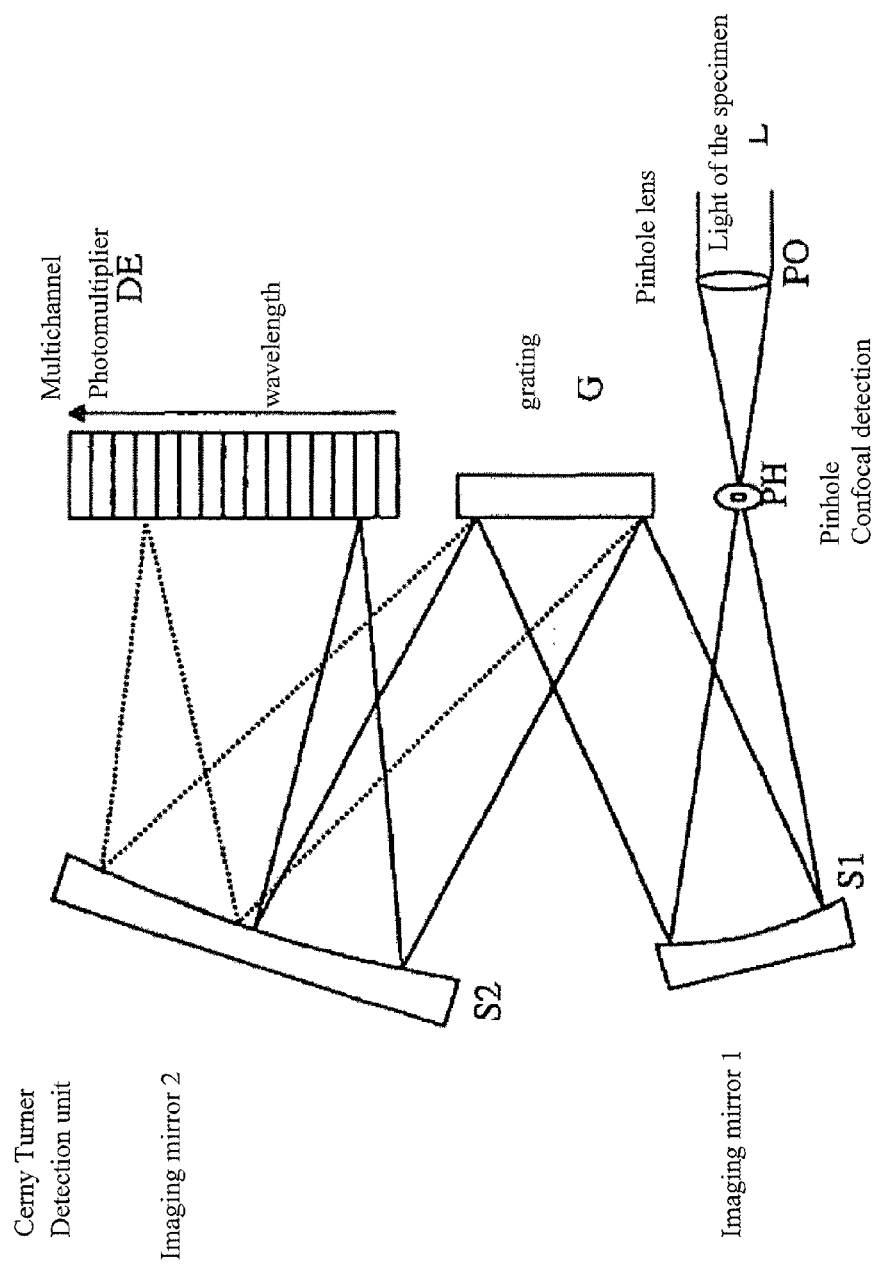
FIG. 6 is a schematic diagram of an arrangement for spectral detection using a PMT line detector.

FIG. 6 shows an arrangement for spectral detection using a PMT line detector in a laser scanning microscope according to DE 10033180 A1. The optical configuration describes essentially a Cerny-Turner configuration. In confocal detection, the light L of the specimen is focused with the pinhole lens PO through the confocal aperture PH. This aperture may also be omitted in non-descanned detection in a case of multiphoton absorption. The first imaging minor S1 collimates the fluorescent light. Next the light strikes a line grating G, for example, a grating having a line count of 651 lines per mm. The grating deflects the light in various directions according to its wavelength. The second imaging mirror S2 focuses the individual spectrally split wavelength components on the corresponding channels of a PMT line detector DE, for example, a line photomultiplier (such as a photomultiplier tube, PMT) H7260 from Hamamatsu Corporation, Bridgewater, N.J. 08807. The detector has 32 channels and a high sensitivity. The free spectral range of the embodiment described above amounts to approximately 350 nm. The free spectral range in this arrangement is uniformly distributed among the 32 channels of the line detectors, thus yielding an optical resolution of approximately 10 nm. The use of the arrangement in an imaging system is advantageous because the signal per detection channel is still relatively strong due to the relatively broad detected spectral band. A shift in the free spectral range may be achieved by a rotation of the grating or a displacement of the detector, for example.

The aforementioned line detector has webs (light-insensitive regions) having a width of 0.2 mm between the adjacent individual channels (light-sensitive regions). FIG. 6 shows the focusing on the detector for two discrete wavelengths. However, as a rule, the fluorescent light coming from the specimen generates a continuous spectrum, so that the light is also focused on the webs between the individual channels. These webs therefore have a negative effect on the efficiency of the detection device.

By using a light deflection element according to the present invention, detection light which would be focused on the webs is deflected onto the individual channels of the line detector and the detector efficiency is increased.

On striking the webs, the detection light may also be scattered onto neighboring individual channels in an uncontrolled manner. This so-called cross-talk between the individual channels can falsify the measurement result.

This cross-talk can also be minimized by using a light deflection element. The light deflection element may either be installed in its own frame at a distance from the PMT line detector or glued to the entrance window of the PMT line detector. The latter version is preferred to prevent misalignment.

In manufacturing such an arrangement, the problem encountered is how to join the light deflection element to the detector by an adhesive bond which will survive great temperature fluctuations (Δ35° C. @ 1 min [sic; Δ35° C./min]) when the PMT line detector is cooled by active Peltier cooling, for example. The PMMA, which is preferably used for the light deflection element, has a very different expansion coefficient than glass, e.g., borosilicate glass, which is used for the entrance window of the PMT line detector. Although optical adhesives are available for such requirements, they must cure under strong UV light. However, PMMA is not transparent for these wavelengths; in addition, the PMT line detector, which is very sensitive to the strong radiation burdens that occur with a corresponding adhesive curing, is already on the glass side. Direct mounting is thus ruled out.

Figure 7:
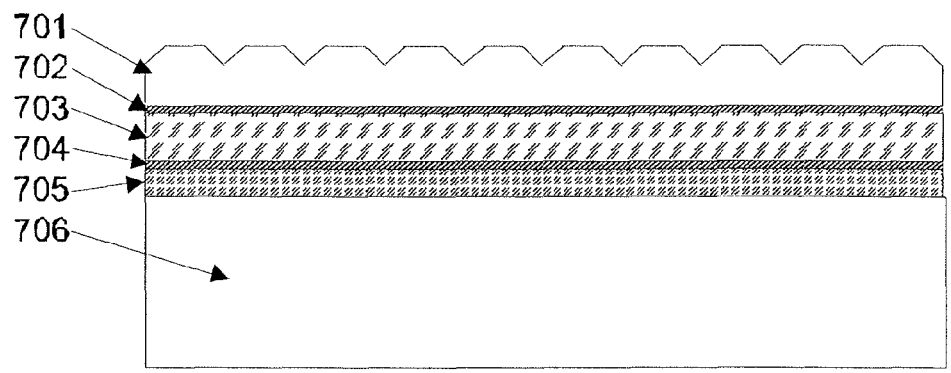
FIG. 7 is a schematic drawing to explain the construction of an embodiment of the present invention.

This problem is solved by a sandwich structure as illustrated in FIG. 7. The light deflection element 701, which is made of PMMA, is first attached to a separate glass body 703 by means of a first adhesive bond 702, preferably a UV adhesive. The glass body is designed to be so strong in relation to the PMMA light deflection element that it can absorb the mechanical forces of the PMMA and can deform the PMMA if necessary. Next the PMMA-glass element is attached to the entrance window 705 of the PMT line detector 706 by means of a glass-glass adhesive bond 704. This glass-glass adhesive bond 704 may preferably be accomplished by means of air-curing glass adhesives.

Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically disclosed.

The invention claimed is:

1. A detector arrangement comprising:
a light detector having a plurality of light sensitive regions and a plurality of light insensitive regions, the light sensitive regions being separated from each other by the light insensitive regions;
a light deflection element above the light detector, which has a plurality of groups of light entrance surfaces, each group having a planar first light entrance surface and at least one planar second light entrance surface adjacent thereto, each of the first light entrance surfaces being located above one of the light sensitive regions and each second light entrance surface being located above one of the light insensitive regions, wherein the first light entrance surface of each group is oriented substantially perpendicular to light incident on the detector arrangement so that the incident light strikes the light sensitive region therebeneath with substantially no deflection due to refraction, and wherein each second light entrance surface of each group is inclined relative to the incident light and to the first light entrance surface of the group to deflect the incident light by refraction onto the light sensitive region below the first light entrance surface of the group.

2. The detector arrangement according to claim 1, wherein the at least one second light entrance surface and the first light entrance surface are arranged at regular intervals.

3. The detector arrangement of claim 1, wherein the detector is a line detector.

4. The detector arrangement of claim 1, wherein the detector is an area detector.

5. The detector arrangement of claim 1, wherein the light deflection element is made from a contiguous material having the plurality of planar light entrance surfaces formed therein.

6. The detector arrangement of claim 1, wherein each of the groups of light entrance surfaces is formed as an individual unit, and the light deflection element is composed of multiple individual groups joined together.

7. The detector arrangement according to claim 1, wherein the light deflection element is made of PMMA.

8. The detector arrangement according to claim 7, further comprising a glass substrate wherein the light deflection element is applied to the glass substrate.

9. The detector arrangement according to claim 8, wherein the detector is a cooled PMT detector having a glass window, and the glass substrate is adhesively bonded to the glass window of the PMT detector.

10. The detector arrangement according to claim 1, wherein the incident light is focused.

11. The detector arrangement according to claim 1, wherein the incident light is collimated.

12. A microscope, preferably a laser scanning microscope, comprising the detector arrangement according to claim 1.

* * * * *